Figure 1:
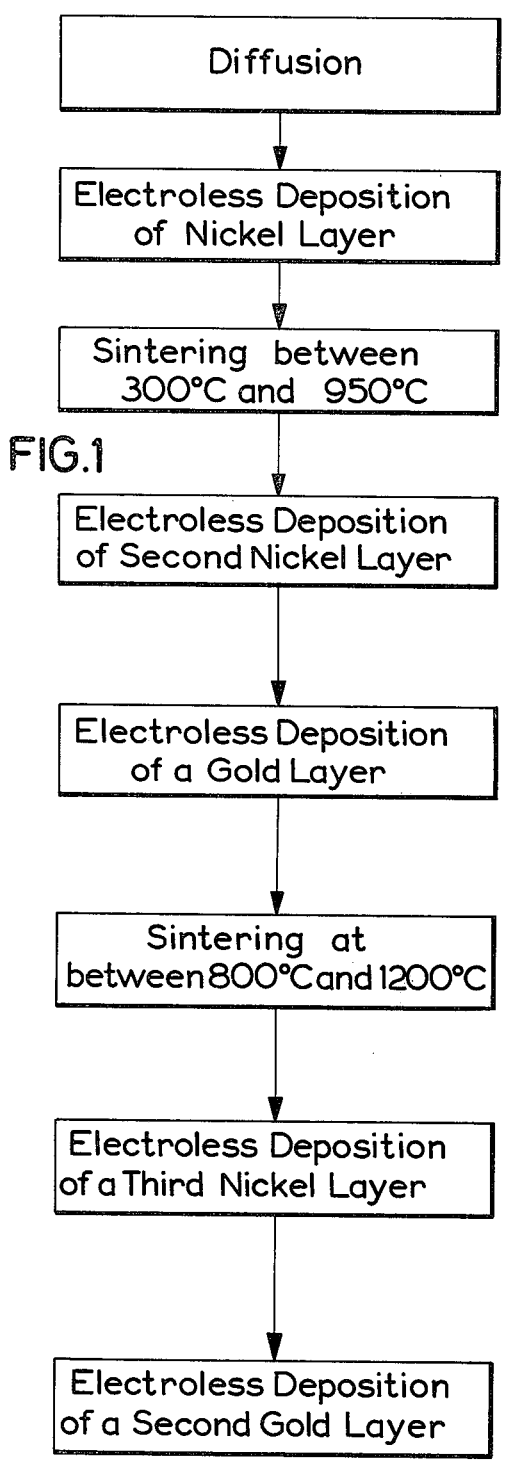

United States Patent [19]
Leibfried et al.

[11] 3,949,120
[45] Apr. 6, 1976

[54] METHOD OF MAKING HIGH SPEED SILICON SWITCHING DIODES

[75] Inventors: Wolfgang Leibfried, Leonberg; Wolfgang Schynoll, Bietigheim; Dietrich Wulff, Gerlingen, all of Germany

[73] Assignee: Robert Bosch G.m.b.H., Stuttgart, Germany

[22] Filed: Oct. 19, 1973

[21] Appl. No.: 408,093

Related U.S. Application Data

[63] Continuation of Ser. No. 196,941, Nov. 9, 1971, abandoned.

[30] Foreign Application Priority Data

Dec. 2, 1970 Germany............................ 2059175

[52] U.S. Cl. ..................... 427/89; 427/92; 427/383
[51] Int. Cl.² .......................................... B05D 5/12
[58] Field of Search ........ 117/217; 427/89, 92, 383, 427/304, 305

[56] References Cited
UNITED STATES PATENTS

| | | | |
|---|---|---|---|
| 3,300,340 | 1/1967 | Calandrello et al. | 117/217 |
| 3,362,851 | 1/1968 | Dunster | 117/217 |
| 3,539,391 | 11/1970 | Lepiane | 117/217 |

*Primary Examiner*—Cameron K. Weiffenbach
*Attorney, Agent, or Firm*—William R. Woodward

[57] ABSTRACT

To decrease the lifetime of minority carriers and thus increase switching speed, gold is diffused into a silicon body, the gold being applied by first electroless applying a nickel layer to a single crystal silicon to activate the silicon for reception of gold; and then, electroless applying the gold layer over the silicon layer. In accordance with a preferred process, the electrolessly applied nickel layer is sintered, a second nickel layer is applied thereover and the gold then applied over the second additional nickel layer. A further layer of nickel can be applied electrolessly, over which gold is applied to form a contact surface to which a contact wire can be soldered or fused.

6 Claims, 9 Drawing Figures

U.S. Patent    April 6, 1976    3,949,120

METHOD OF MAKING HIGH SPEED SILICON SWITCHING DIODES

This is a continuation of application Ser. No. 196,941, filed Nov. 9, 1971, now abandoned.

The present invention relates to a method to make silicon switching diodes and more particularly to make switching diodes which have extremely high switching speed. To improve the switching speed of such silicon diodes, the lifetime of the minority carriers is to be decreased, by incorporating gold atoms into the single crystal semi-conductor by a sintering process.

U.S. Pat. No. 3,067,485 discloses a process in which a layer of gold is applied directly to the surface of a semi-conductor body. various ways to apply the gold are proposed: electroplating, evaporation deposition, spraying, or painting a gold solution on a slice of semiconductor material. All the proposed methods are expensive when high speed switching diodes are to be made in a mass production process.

It is an object of the present invention to provide a simple process which is inexpensive and reliable and in accordance with which high speed silicon diodes, having gold atoms diffused therein, can be inexpensively made.

SUBJECT MATTER OF THE PRESENT INVENTION

Briefly, a slice of semiconductor material has a nickel layer applied thereto by electroless deposition, and the gold layer is then applied over the nickel layer by electroless deposition. The nickel layer activates the semiconductor for application of the gold.

In accordance with a preferred embodiment, the nickel layer is first sintered to form a layer of nickel silicide, the gold then being applied. Before application of the gold to the nickel silicide layer, a second nickel layer can be applied on the nickel silicide, by electroless deposition.

After application of the layer of gold, the semi-conductor slice is sintered at a temperature of between 800° and 1200° C, to form a layer of the three phases gold, nickel and silicon.

The connecting wire can be soldered on a nickel layer which is applied by electroless deposition to the layer formed of the three phases gold, nickel and silicon; a layer of gold can be applied to this nickel layer in order to protect the nickel electrode forming a contact electrode against oxidation before the connecting wire is soldered thereto.

DRAWINGS

FIG. 1 illustrates a flow diagram in which the sequence of steps is outlined and FIGS. 2a to 2h illustrate a sequence of schematic vertical sections through the semiconductor body, illustrating in schematic form the semiconductor body as the steps of FIG. 1 proceed.

The semiconductor diode, for example, has the following structure: $n^+pp^+$. The starting material is a disk, or slice of semiconductor material which is made in suitable manner, well known in the art, from a single crystal p-type semiconductor material, obtained for example first by sawing, lapping, etching and then washing the semiconductor slice.

Figure 2A:
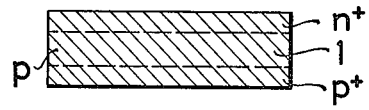
Figure 2B:
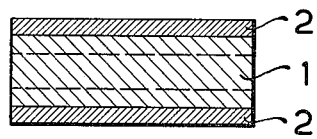

Referring now to the drawings, the first step in the process comprises doping the semiconductor with boron on the one side, and with phosphorus on the other; the body will have the junctions illustrated schematically in FIG. 2a, namely $n^+pp^+$. The boron and phosphorus are diffused into the body. In the next step, nickel layers 2 are applied to both sides of the body, see FIG. 2b. The nickel is applied by electroless deposition of nickel from an aqueous solution containing nickel chloride and sodium per phosphate.

Figure 2C:
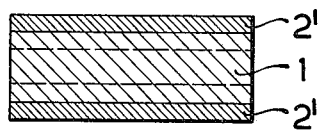

The semiconductor body 1 with the nickel layers 2 is then thoroughly washed and dried, and then tempered, or sintered, at a temperature of between 300° to 950°C, the nickel layers 2 alloying into the silicon body and forming a layer of nickel silicide 2' — see FIG. 2c.

Figure 2D:
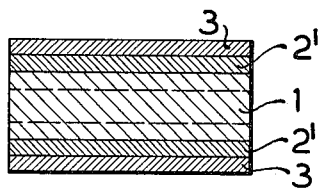
Figure 2E:
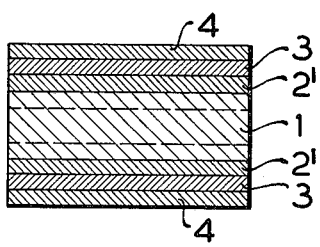
Figure 2F:
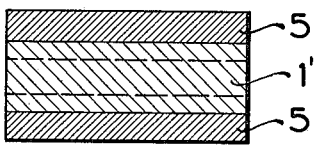

A second nickel layer 3 is applied above the layer of nickel silicide 2' by electroless deposition, see FIG. 2d. Thin gold layers 4 are then applied over the nickel layers 3. The thickness of the gold layers, each, may be in the order of several hundred A. The gold is deposited from a gold bath solution at a temperature of between 60° and 95° C. A portion of the non-precious nickel goes into solution, and equivalent amounts of gold precipitate, see FIG. 2e.

The semiconductor 1, supplied with layers 2', 3 and 4 on both sides, is now sintered at a temperature of between 800° and 1200° C. A layer 5 formed of the three phases gold, nickel and silicon forms both at the top and bottom side of the semiconductor body, see FIG. 2f. The nickel and gold impurities diffuse into the silicon semiconductor body 1 to form body 1' in which the nickel and gold are accepted as additional doping substances. The nickel impurities neutralize the thermal recombination centers within the silicon. The gold impurities in the silicon act both as doping agents as well as recombination centers. The introduction of the gold centers into the semiconductor crystal effects a decrease of the lifetime of the minority charge carriers. Dependent on the temperature at sintering of the gold layer, the reverse recovery time $\tau_{rr}$ decreases from a normal diode, not having the gold, from about $10^{-5}$ seconds to $10^{-6}$ to $10^{-8}$ seconds in the switching diode in accordance with the present invention. Here the "$\tau_{rr}$" of the diode is measured conventionally by switching a forward current of 20 mA blocking current of 2 mA.

Contact or terminal wires are applied to the thus made diode in the following steps: The semiconductor 1', having the layer 5 applied thereto, has applied a third layer of nickel (FIG. 2g) and a subsequent layer of gold 7 (FIG. 2h) of a thickness of several hundred A units, to prevent oxidation of the third nickel layer 6.

The deposition of the nickel layer 6 (FIG. 2g) is carried out by electroless deposition of nickel from an aqueous solution of nickel chloride and sodium per phosphate; the deposition of the gold layer 7 (FIG. 2h) is carried out from a gold solution at a temperature of between 60° and 95°C. The same types of baths, or solutions may be used as were previously used in the position of layers 2 and 3, or layer 4 respectively.

The semiconductor body 1', supplied with the layers 5, 6 and 7 is then severed to form the various semiconductor elementary slices. These elementary slices are then connected to the connection leads, and the leads are soldered thereto. Subsequent chemical treatment, painting or lacquering, aging at elevated temperature of the like, to stabilize the properties of the diode can then be carried out, and the diode can then be encapsulated.

Various changes and modifications may be made in the process, and in the compositions used therein.

Figure 2G:
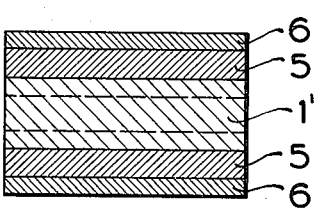
Figure 2H:
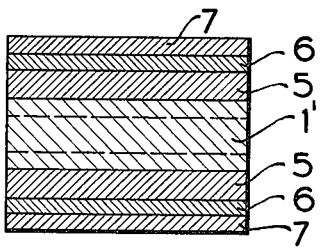

A method of applying nickel-gold contacts to semiconductors, for example carry out the steps illustrated in FIGS. 2g and 2h is disclosed in U.S. Pat. No. 3,362,851.

What is claimed is:

1. Method of making high speed silicon switching diodes comprising the steps of:

electroless applying a nickel layer to the sides of a slice of single crystal silicon material having a long charge carrier lifetime corresponding to a diode reverse recovery time of approximately $10^{-5}$ seconds, said slice having a p-n junction therein intermediately between its sides so as to provide a diode structure (2,2',3);

electroless applying a gold layer (4) over the nickel layer;

and sintering the slice, after applying the gold layer (4) at a temperature of between 800° and 1200°C to reduce the charge carrier lifetime in said wafer by diffusing both nickel and gold into said silicon slice, whereby a composite layer (5) of gold, nickel and silicon is formed on the sides of said silicon slice.

2. Method according to claim 1, wherein the steps of electroless applying the nickel layers (2, 6) are carried out with similar aqueous solutions.

3. Method according to claim 1, including the step of sintering the nickel layer (2') before applying the gold layer to form a nickel silicide layer.

4. Method according to claim 3, including the step of applying an additional nickel layer (3) over the sintered nickel silicide layer.

5. Method according to claim 1, including the step of electroless applying a further layer of nickel (6) over the sintered composite layer of the three phases gold, nickel and silicon, to form a contact electrode.

6. Method according to claim 5, including the step of electroless applying a further layer of gold (7) over the further nickel layer (6) forming the contact electrode, before soldering an attachment lead, to prevent oxidation of the nickel layer (6).

* * * * *